(12) United States Patent
Nakashiba

(10) Patent No.: US 6,498,622 B1
(45) Date of Patent: Dec. 24, 2002

(54) HIGH OUTPUT CMOS-BASED IMAGE SENSOR

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/189,963

(22) Filed: Nov. 10, 1998

(30) Foreign Application Priority Data

Nov. 11, 1997 (JP) .............................................. 9-323975

(51) Int. Cl.⁷ ...................... H04N 5/335; H01L 31/0232
(52) U.S. Cl. ......................... 348/308; 348/302; 257/435
(58) Field of Search ................................ 348/243, 244, 348/245, 302, 308; 250/208.1; 257/435

(56) References Cited

U.S. PATENT DOCUMENTS

| | | | | |
|---|---|---|---|---|
| 4,200,892 A | * | 4/1980 | Weimer ....................... | 348/310 |
| 5,668,390 A | | 9/1997 | Morimoto | |
| 5,835,141 A | * | 11/1998 | Ackland et al. ............ | 348/308 |
| 6,115,065 A | * | 9/2000 | Yadid-Pecht et al. ....... | 348/308 |

FOREIGN PATENT DOCUMENTS

| | | |
|---|---|---|
| EP | 0487989 | 11/1990 |
| JP | 61-129354 | 8/1986 |
| JP | 7-58308 | 3/1995 |

OTHER PUBLICATIONS

Nikkei Microdevice, Jul. 1997 issue, pp. 120–125.
Chye Huat Aw et al: "A 128×128–picxel Standard–CMOS Image Sensor with Electronic Shutter" *IEEE International Solid–State Circuits Conference* vol. 39, Feb. 1, 1996 p. 180.
Mendis S K et al: "A 128 × 128 CMOS Active Pixel Image Sensor for Highly Integrated Imaging Systems" *Proceedings of the International Electron Devices Meeting, Washington,* Dec. 5–8, 1993 p. 583.

Mendis, Sunetra K. et al., "A 128 × 128 CMOS Active Pixel Image Sensor for Highly Integrated Imaging Systems", 1993, IEEE, pp. 583–586.

* cited by examiner

Primary Examiner—Wendy R. Garber
Assistant Examiner—Lin Ye
(74) Attorney, Agent, or Firm—Choate, Hall & Stewart

(57) ABSTRACT

An image sensor has multiple light shields of conductive material, the light shields being formed with respective openings. A matrix array of unit cells are formed on a semiconductor body so that they respectively correspond to the light shields. Each unit cell includes a photosensitive region for receiving imagewise radiation through the opening of the corresponding light shield for producing photo-generated electrons, a floating diffusion region, and a transfer gate for transferring the photo-generated electrons from the photosensitive region to the floating diffusion region. An amplifying transistor is provided having a controlling terminal connected to the floating diffusion region for amplifying a potential developed in the floating diffusion region and a controlled terminal connected to the corresponding light shield. As a result, each light shield is biased at a potential that substantially varies with the potential of the floating diffusion region.

8 Claims, 2 Drawing Sheets

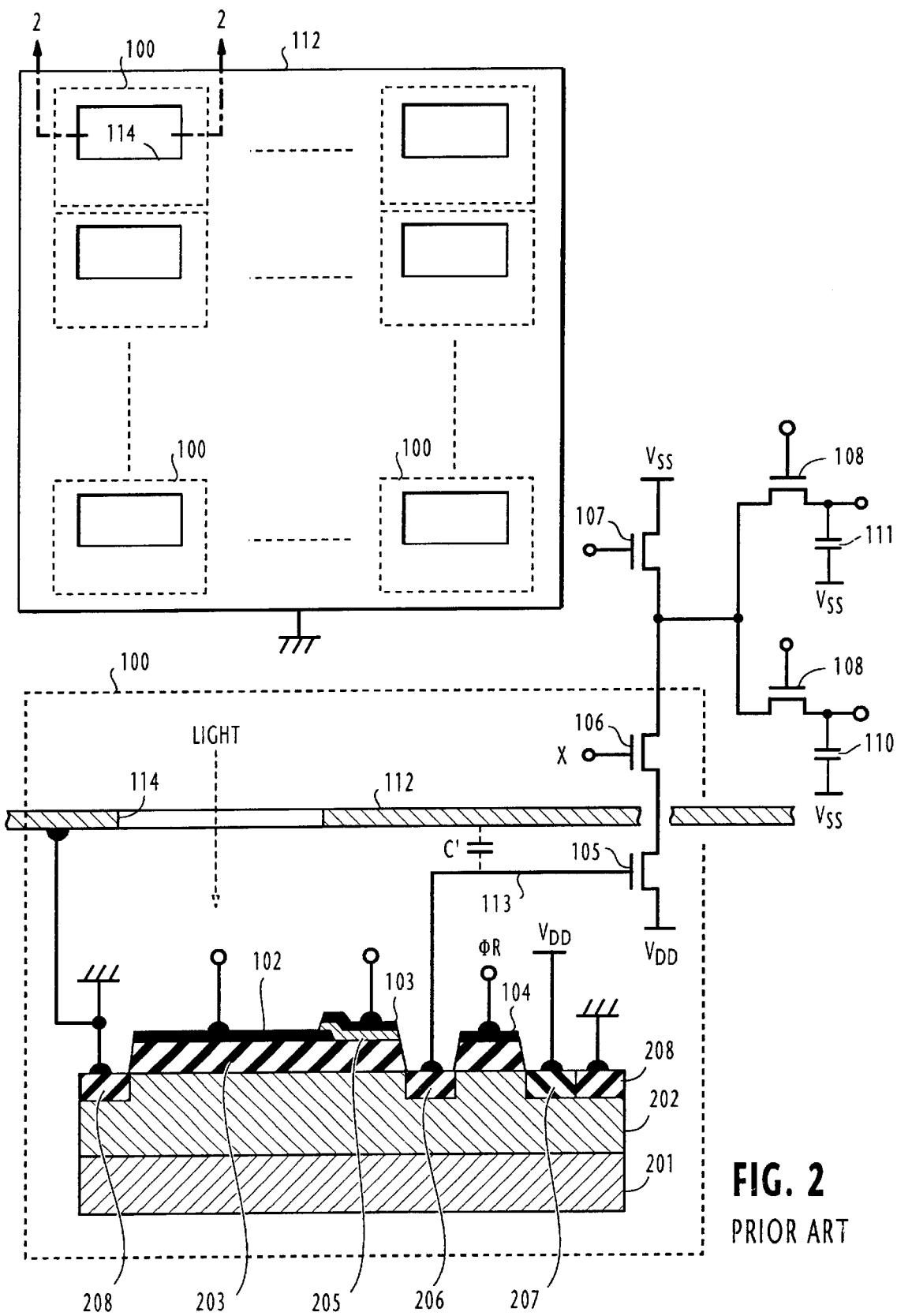

HIGH OUTPUT CMOS-BASED IMAGE SENSOR

BACKGROUND OF THE INVENTION

1. Field of the Invention

The present invention relates generally to image sensors, and more specifically to a CMOS-based image sensor.

2. Description of the Related Art

CMOS (complementary metal oxide semiconductor) based image sensors are characterized by low power consumption, operability on a single voltage source (5 or 3.3 volts) and amenability to integration with peripheral circuitry on a common chip, as described in a paper titled "A 128×128 CMOS Active Pixel Image Sensor for Highly Integrated Imaging Systems", Sunetra K. Mendis et al., IEDM 93, pages 583 to 586.

However, one disadvantage of the current CMOS-based image sensor is that the output voltage it generates is not of sufficient value.

SUMMARY OF THE INVENTION

It is therefore an object of the present invention to provide a CMOS-based image sensor capable of producing a high voltage output.

The present invention is based on a recognition that there is a stray capacitance between a grounded conductive light shield covering portions of the image sensor other than photosensitive areas and a conductor extending parallel with the light shield. It is found that the presence of this stray capacitance is the source of the stated problem.

The problem is solved by segmenting the conventional light shield into a plurality of unit light shields respectively corresponding to unit cells of the image sensor and biasing each unit light shield at a potential which varies with the output voltage of the corresponding unit cell.

According to the present invention, there is provided an image sensor comprising a plurality of light shields of conductive material, the light shields being formed with respective openings. A matrix array of unit cells are formed on a semiconductor body so that they respectively correspond to the light shields. Each of the unit cells includes a photosensitive region for receiving light through the opening of the corresponding light shield for producing photo-generated electrons, a floating diffusion region, a transfer gate for transferring the photo-generated electrons from the photosensitive region to the floating diffusion region, and an amplifying transistor having a controlling terminal connected to the floating diffusion region for amplifying a potential developed in the floating diffusion region and a controlled terminal connected to the corresponding light shield, so that the light shield is ii biased at a potential that substantially varies with the potential of the floating diffusion region.

BRIEF DESCRIPTION OF THE DRAWINGS

The present invention will be described in further detail with reference to the accompanying drawings, in which:

FIG. 1 is a plan view of a prior art CMOS image sensor;

FIG. 2 is a cross-sectional view of a unit cell of the prior art CMOS image sensor taken along the lines 2—2 of FIG. 1;

DETAILED DESCRIPTION

Figure 3:
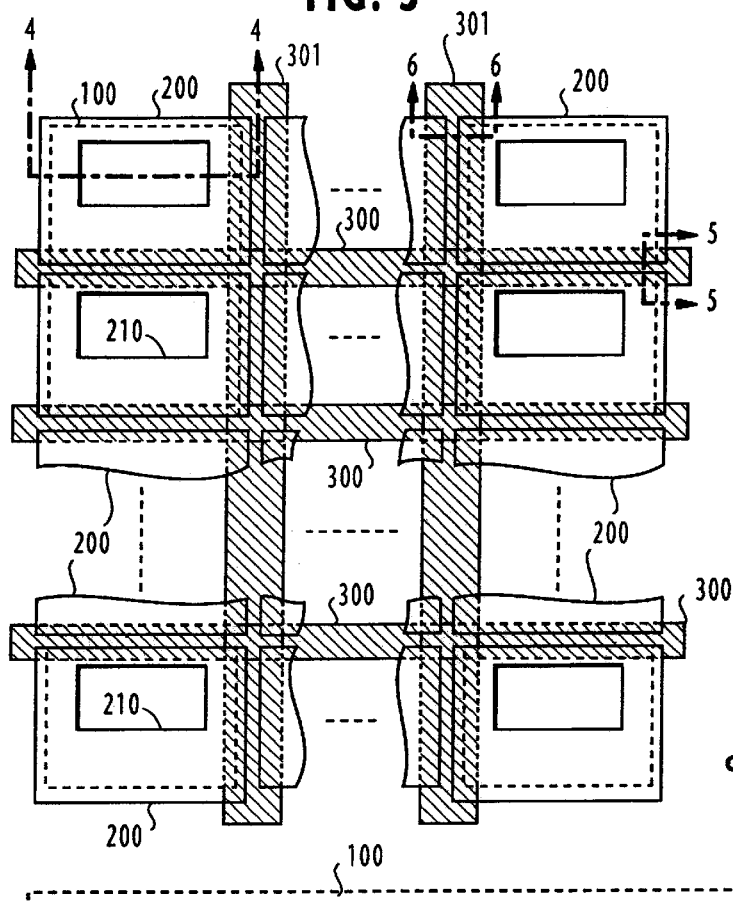
FIG. 3 is a plan view of a CMOS image sensor of the present invention.

Before proceeding with the detailed description of the present invention, it may prove helpful to provide an explanation of the prior art with reference to FIGS. 1 and 2.

As shown in FIG. 1, the prior art CMOS image sensor consists of a matrix array of pixel unit cells 100 and all the unit cells of the matrix array are overlaid with a metallic light shield 112. Each unit cell has a photosensitive area, or photo-gate 102 and the light shield 112 has a plurality of openings for allowing external light to pass therethrough to the photo-gates 102 of the underlying unit cells. Each pixel unit cell of the prior art consists of a polysilicon photo-gate 102, a transfer gate 103 and a gate 104 of a reset transistor. A source-follower amplifier transistor 105, a row (X) selection transistor 106 and a source-follower load transistor 107 are connected between voltage sources $V_{DD}$ and $V_{SS}$. The load transistor 107 is located at one end of each column of pixels, where two sample-and-hold circuits are provided. One sample-and-hold circuit consists of a sampling transistor 108 and a holding capacitor 110, the other sample-and-hold circuit consisting of a sampling transistor 109 and a holding capacitor 111. Sampling transistor 108 is further connected to a column ($Y_1$) selection transistor, not shown, to produce a positive output signal and the sampling transistor 109 is further connected to column ($Y_2$) selection transistor, not shown, to produce a negative output signal. Note that the light shield 112 is connected to ground to be maintained at the reference potential.

The unit cell is fabricated on a common p-type semiconductor substrate 201 on which a p-type well 202 and a lower insulating film 203 are formed. There is an upper insulating film 205 on the insulating film 203, with the upper insulating film 205 slightly covering part of the photo-gate 102 to allow the transfer gate 103 to partially overlap the photo-gate 102. An $n^+$-type floating diffusion region 206 and an $n^+$-type region 207 are formed in the p-type well 202. The floating diffusion region 206 is connected by a conductor 113 to the gate of row selection transistor 106 and the $n^+$ region 207 is connected to the voltage source $V_{DD}$ to function as the drain of the reset transistor. P+-type channel stoppers 208, which are grounded, bound the unit cell.

In operation, the photo-gate 102 is first supplied with a high voltage pulse to increase the potential of a depletion region that is formed under this gate. During the signal integration period, photo-generated electrons are collected in the depletion region. The gate 104 of reset transistor is biased at a high voltage to act as a lateral anti-blooming drain and the row selection transistor 106 is biased off. Following signal integration, a row of pixels to be read out is addressed by enabling row selection transistor 106. Setting the photo-gate 102 as well as the transfer gate 103 and the gate 104 of reset transistor at a low voltage then decreases the potential of the depletion region and lowers the potential barrier between the depletion region and the floating diffusion region 206. This allows the photo-generated electrons to be emptied into the floating diffusion region 206, causing its potential to rise. This potential variation is sensed and amplified by transistor 105 and delivered to the output when the row selection transistor 106 is enabled. Although kTC noise is generated in the floating diffusion region 206, the effect of this noise is eliminated by sampling the negative and positive signals using the sample and hold circuits and taking the difference between the sampled values.

While the prior art solid state image sensor is compatible with the CMOS manufacturing process, it has a disadvantage in that the voltage available from its output circuit is low.

According to the present invention, it is found that there is a stray capacitance C' between the light shield 112 and the conductor 113. This stray capacitance C' is an extra amount of capacitance which adds up to the intentional capacitance C of the floating diffusion region 206. Since the voltage variation V of the floating diffusion region 206 is given by V=Q/(C+C'), where Q is the quantity of electrons stored in the diffusion region 206, the output voltage of the prior art image sensor is undesirably reduced as a result of the stray capacitance.

Figure 4:
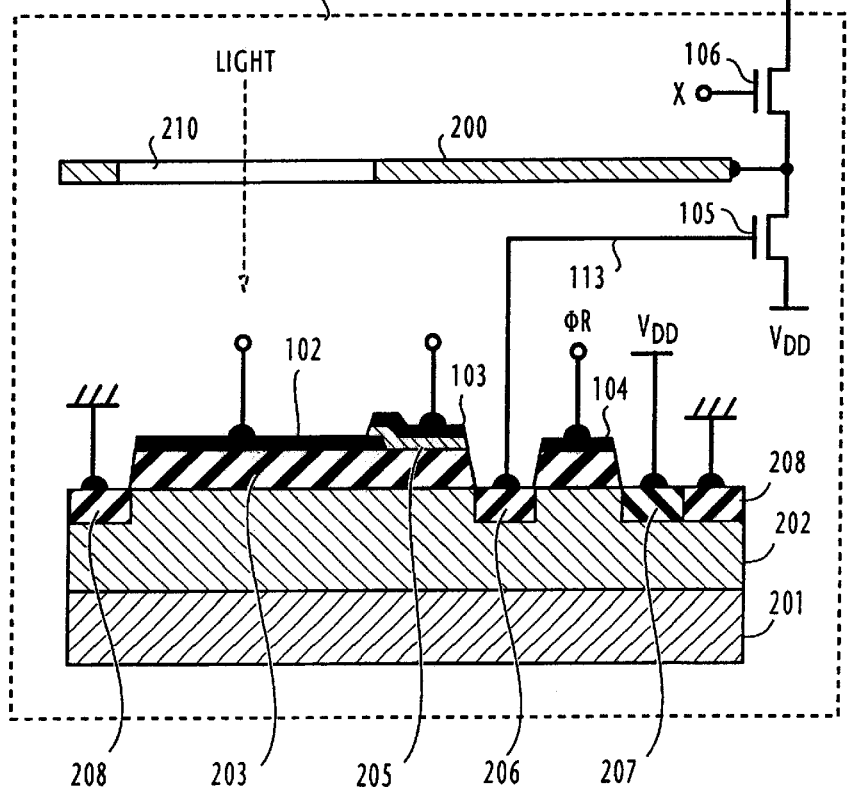
FIG. 4 is a cross-sectional view of a unit cell of the image sensor of the present invention taken along the lines 4—4 of FIG. 3.

The image sensor of the present invention is shown in FIGS. 3 and 4, wherein parts corresponding in significance to those of FIGS. 1 and 2 are marked by the same numerals as those in FIGS. 1 and 2. It is seen in FIG. 3 that the metallic light shield 112 of the prior art is divided into a plurality of light shields 200 which respectively overlies the corresponding unit cells. Each light shield 200 has an opening 210 to expose the photo-gate 102 to external imagewise radiation. In FIG. 4, it is seen that each light shield 200 is connected to the source of transistor 105, instead of being to the ground terminal. As a result of this connection, a voltage variation is generated in each light shield 200 by an amount equal to the source voltage multiplied by the gain of the source-follower amplifier transistor 105. This voltage variation is approximately equal to the voltage variation of the floating diffusion region 206.

If the conductor 113 is biased at a potential V and the source-follower transistor 105 has a gain a, the light shield 200 develops a voltage αV. Therefore, the voltage difference ΔV between light shield 200 and conductor 113 is equal to ΔV=V−αV=V(1−α). Since the value α is normally 0.9, the voltage difference αV can be practically ignored. Accordingly, the undesirable effect of the stray capacitance between light shield 200 and conductor 113 can be reduced by a factor (1−α), i.e., 0.1 times as compared to the prior art unit cell. This results in an image sensor producing an increased output voltage.

Figure 5:
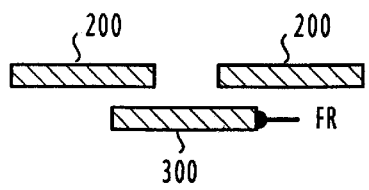
FIG. 5 is a cross-sectional view taken along the line 5—5 of FIG. 3.
Figure 6:
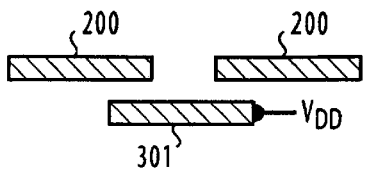
FIG. 6 is a cross-sectional view taken along the line 6—6 of FIG. 3;.

Since the light shields are separated from each other, there is a possibility that undesired light may intrude through the spacing between adjacent light shields and impinge on the photo-sensitive areas. In order to avoid this problem, horizontally elongated metallic shields 300 are provided below the vertical spacing between adjacent light shields 200 as shown in FIG. 5, and vertically elongated metallic shields 301 are provided below the horizontally spacing between adjacent light shields 200, as shown in FIG. 6. Light shields 200 and the additional light shields 300 and 301 are electrically isolated from each other.

In the present invention, the light shields 300 and 301 are advantageously used as metallic wiring. Particularly, the light shields 300 are used as conductors for supplying reset pulse φR to the gates 104 of the reset transistors of the same row. Light shields 301 are used for supplying the voltage $V_{DD}$ to all the unit cells.

What is claimed is:

1. An image sensor comprising:
   a plurality of light shields of electrically conductive material, said light shields being formed with respective openings;
   a semiconductor body;
   a matrix array of unit cells formed on said semiconductor body respectively corresponding to said light shields, each of said unit cells comprising:
   a photosensitive region for receiving light through the opening of the corresponding light shield for producing photo-generated electrons;
   a floating diffusion region;
   a transfer gate for transferring said photo-generated electrons from said photosensitive region to said floating diffusion region; and
   an amplifying transistor having a controlling terminal connected to the floating diffusion region for amplifying a potential developed in the floating diffusion region and a controlled terminal connected to the corresponding light shield, so that the corresponding light shield is biased at a potential which substantially varies with the potential of said floating diffusion region.

2. The image sensor of claim 1, wherein said amplifying transistor is a source-follower transistor and said corresponding light shield is connected to the source of the source-follower transistor.

3. The image sensor of claim 1, wherein the controlling terminal of said amplifying transistor is connected to said floating diffusion region by a conductor extending parallel with the corresponding light shield.

4. The image sensor of claim 1, further comprising a plurality of elongated members of electrically conductive material, each of said elongated members being provided in such a location as to prevent external light from intruding through a separation between adjacent ones of said light shields.

5. The image sensor of claim 1, further comprising a plurality of elongated first members of electrically conductive material and a plurality of elongated second members of electrically conductive material, each of said first members being provided in such a location as to prevent external light from intruding through a first separation between adjacent rows of said light shields and each of said second members being provided in such a location as to prevent external light from intruding through a second separation between adjacent columns of said light shields.

6. The image sensor of claim 5, wherein said first members are arranged to supply a pulse to the unit cells of each row of said matrix array.

7. The image sensor of claim 5, wherein said second members are arranged to supply an operating voltage to the unit cells of each column of said matrix array.

8. The image sensor of claim 6, wherein said second members are arranged to supply an operating voltage to the unit cells of each column of said matrix array.

* * * * *